(12) United States Patent
Wang (10) Patent No.: US 7,557,407 B2
(45) Date of Patent: Jul. 7, 2009

(54) RECESSED GATE STRUCTURE AND METHOD FOR PREPARING THE SAME

(75) Inventor: Ting Sing Wang, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 398 days.

(21) Appl. No.: 11/435,848

(22) Filed: May 18, 2006

(65) Prior Publication Data
US 2007/0218638 A1    Sep. 20, 2007

(30) Foreign Application Priority Data
Mar. 15, 2006    (TW) ............................... 95108687 A (51) Int. Cl.
H01L 29/76    (2006.01)
H01L 29/94    (2006.01)
H01L 31/062   (2006.01)
H01L 31/113   (2006.01)
H01L 31/119   (2006.01)

(52) U.S. Cl. ................ 257/330; 257/331; 257/E27.091

(58) Field of Classification Search ................ 257/330, 257/331, 332, 334, E27.091
See application file for complete search history.

(56) References Cited

U.S. PATENT DOCUMENTS 4,893,160 A *    1/1990   Blanchard .................. 257/334
6,861,716 B1     3/2005   Hyde
6,867,078 B1     3/2005   Green et al.
6,869,868 B2     3/2005   Chiu et al.

FOREIGN PATENT DOCUMENTS

TW    256940    9/1995
TW    488018    5/2002
TW    588365    5/2004

* cited by examiner

Primary Examiner—Hoai V Pham
(74) Attorney, Agent, or Firm—Oliff & Berridge, PLC (57) ABSTRACT

A recessed gate structure comprises a semiconductor substrate, a recess positioned in the semiconductor substrate, a gate oxide layer positioned in the recess and a conductive layer positioned on the gate oxide layer, wherein the semiconductor substrate has a multi-step structure in the recess. The thickness of the gate oxide layer on one step surface can be different from that on another step surface of the multi-step structure. In addition, the recessed gate structure further comprises a plurality of doped regions positioned in the semiconductor substrate under the multi-step structure, and these doped regions may use different dosages and different types of dopants. There is a carrier channel in the semiconductor substrate under the recessed gate structure and the overall channel length of the carrier channel is substantially the summation of the lateral width and twice of the vertical depth of the recessed gate structure.

7 Claims, 8 Drawing Sheets

RECESSED GATE STRUCTURE AND METHOD FOR PREPARING THE SAME

BACKGROUND OF THE INVENTION (A) Field of the Invention

The present invention relates to a recessed gate structure and method for preparing the same, and more particularly, to a recessed gate structure having an increased channel length by forming a multi-step structure in a recess and method for preparing the same.

(B) Description of the Related Art

Figure 1:
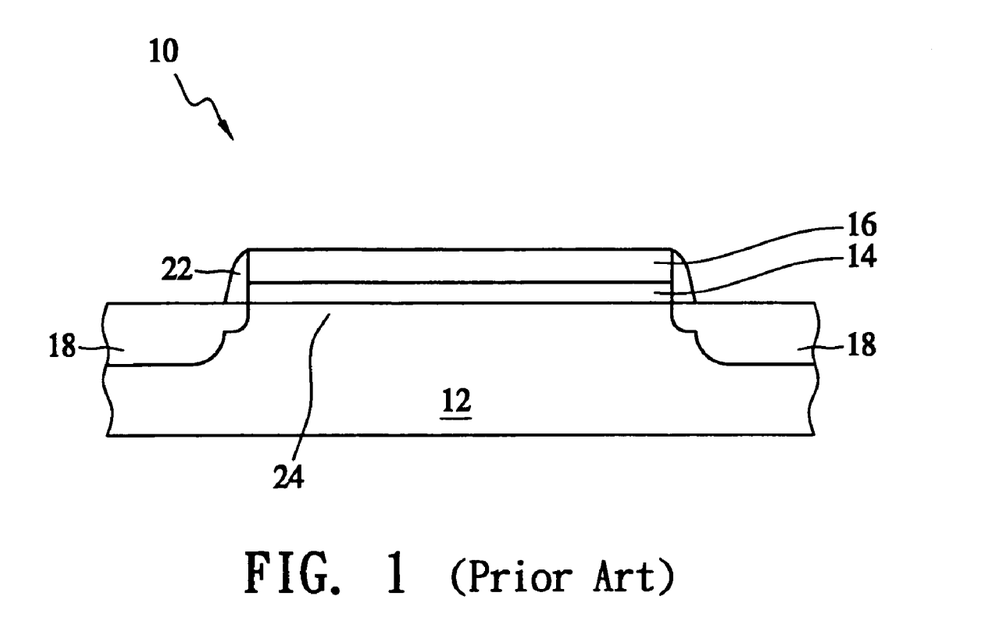
FIG. 1 illustrates a metal-oxide-semiconductor field effect transistor according to the prior art.
Figure 2:
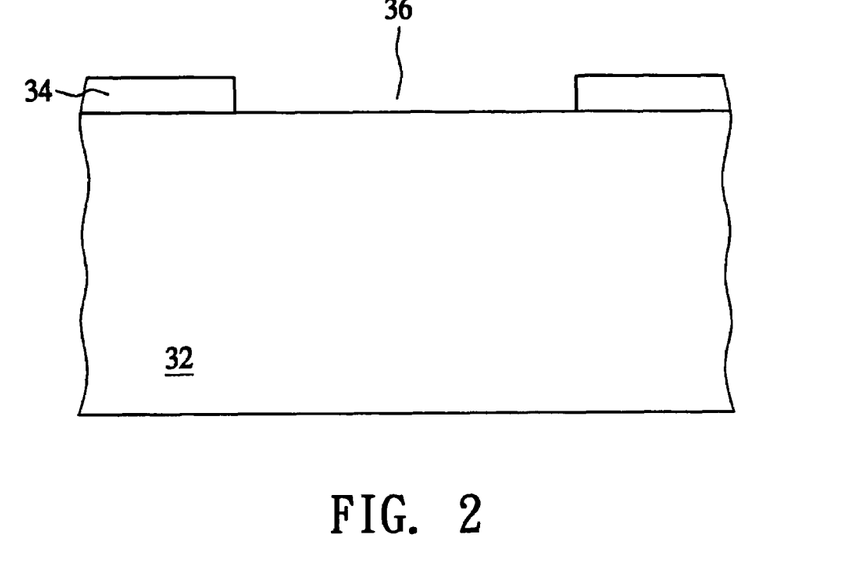
FIG. 2 to FIG. 9 illustrate a method for preparing a recessed gate structure according to one embodiment of the present invention.

FIG. 1 illustrates a metal-oxide-semiconductor field effect transistor (MOSFET) 10 according to the prior art. The transistor 10 is an important basic electronic device including a semiconductor substrate 12, a gate oxide layer 14, a conductive metal layer 16 and two doped regions 18 serving as the source and the drain in the semiconductor substrate 12. The transistor 10 may further include a nitride spacer 22 positioned on the sidewall of the conductive metal layer 16 for isolating the conductive metal layer 16 from the other electronic device on the semiconductor substrate 12.

As semiconductor fabrication technology continues to improve, sizes of electronic devices are reduced, and the size and the channel length of the transistor 10 also decrease correspondingly. The transistor 10 in FIG. 1 has been widely used in the integrated circuit; however, the continuous decreasing of the size and the channel length of the transistor 10 results in a serious interaction between the two doped regions 18 and a carrier channel 24 under the gate oxide layer 14 such that controlling ability of the conductive metal layer 16 on the switching operation of the carrier channel 24 is reduced, i.e., causes the so-called short channel effect, which impedes the functioning of the transistor 10.

SUMMARY OF THE INVENTION

One aspect of the present invention provides a recessed gate structure having an increased channel length by forming a multi-step structure in a recess and method for preparing the same, which can adjust the threshold voltage of a transistor using the recessed gate structure by controlling the thickness of a gate oxide layer on each step surface of the multi-step structure or by controlling the dopant concentration and types of the dopants in the semiconductor substrate under the multi-step structure.

A recessed gate structure according to this aspect of the present invention comprises a semiconductor substrate having a recess, a gate oxide layer positioned in the recess and a conductive layer positioned on the gate oxide layer, wherein the semiconductor substrate has a multi-step structure including a first depression and a second depression in the recess. The thickness of the gate oxide layer on one step surface of the multi-step structure can be different from the thickness of the gate oxide layer on another step surface of the multi-step structure. In addition, the recessed gate structure further comprises a plurality of doped regions positioned in the semiconductor substrate under the multi-step structure, and these doped regions may have different dopant concentrations and different types of dopants.

Another aspect of the present invention provides a method for preparing a recessed gate structure comprising the steps of forming a mask layer having an opening on a semiconductor substrate, forming a recess in the semiconductor substrate under the opening, performing a thermal oxidation process to form a gate oxide layer in the recess and forming a conductive layer filling the recess, wherein the semiconductor substrate has a multi-step structure in the recess. Preferably, the step of forming a recess in the semiconductor substrate under the opening comprises performing an etching process using the mask layer as a first etching mask to form a first depression in the semiconductor substrate under the opening, performing a deposition process and an etching process to form a first spacer on an inner sidewall of the first depression, and etching the semiconductor substrate using the first spacer and the mask layer as a second etching mask to form a second depression.

In addition, the step of forming a recess in the semiconductor substrate under the opening comprises performing a plurality of implanting processes to implant dopants into the semiconductor substrate under the multi-step structure, and the plurality of implanting processes may use different dosages and dopants. Preferably, the plurality of implanting processes may use dopants selected from the group consisting of ions of nitrogen atom, nitrogen gas, nitrous oxide and nitric oxide, which can inhibit the reaction rate of the subsequent thermal oxidation process, i.e., allows control of the thickness of the gate oxide layer on each step surface of the multi-step structure. Further, the plurality of implanting processes may use boron-containing dopants or phosphorous-containing dopants to control the threshold voltage of a transistor using the recessed gate structure.

In comparison with the conventional gate having a horizontally positioned carrier channel with a channel length substantially equal to the lateral width of the gate, one embodiment of the present invention provides a recessed gate structure having a multi-step carrier channel with a channel length substantially equal to the summation of the lateral width (W) and twice of the vertical height (H) of the recessed gate structure. Obviously, the channel length of the carrier under the recessed gate structure is longer than that of the conventional gate, and the short channel effect can therefore be effectively solved. In addition, several implanting processes with different dosages and different types of dopants can be performed during the fabrication process of the multi-step structure to control the thickness of the gate oxide layer and the threshold voltage of a transistor using the recessed gate structure.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 3:
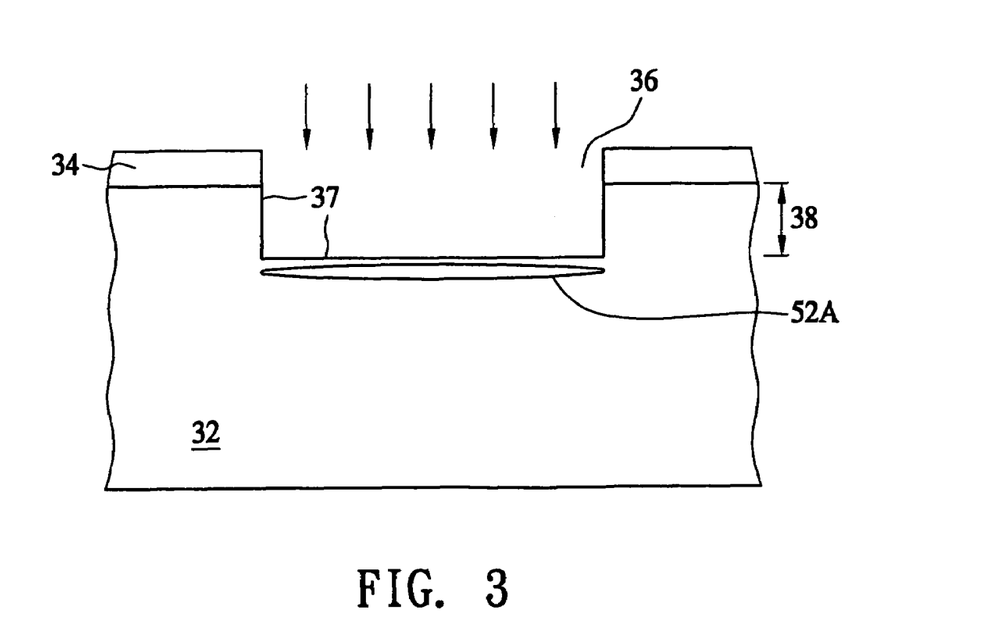

FIG. 2 to FIG. 9 illustrate a method for preparing a recessed gate structure 30 according to one embodiment of the present invention. A mask layer 34 having an opening 36 is formed on a semiconductor substrate 32 such as a silicon substrate, and the mask layer 34 is then used as an etching mask in an etching process to remove a portion of the semiconductor substrate 32 such that a first depression 38 having a first step surface 37 is formed in the semiconductor substrate 32 under the opening 36. The first step surface 37 includes the sidewall and the bottom surface of the first depression 38, and the mask layer 34 is preferably made of dielectric material such as silicon oxide possessing a certain etching selectivity with respect to the silicon substrate. Subsequently, an implanting process is performed to implant dopants into the semiconductor substrate 32 to form a first doped region 52A under the first depression 38, as shown in FIG. 3.

Figure 4:
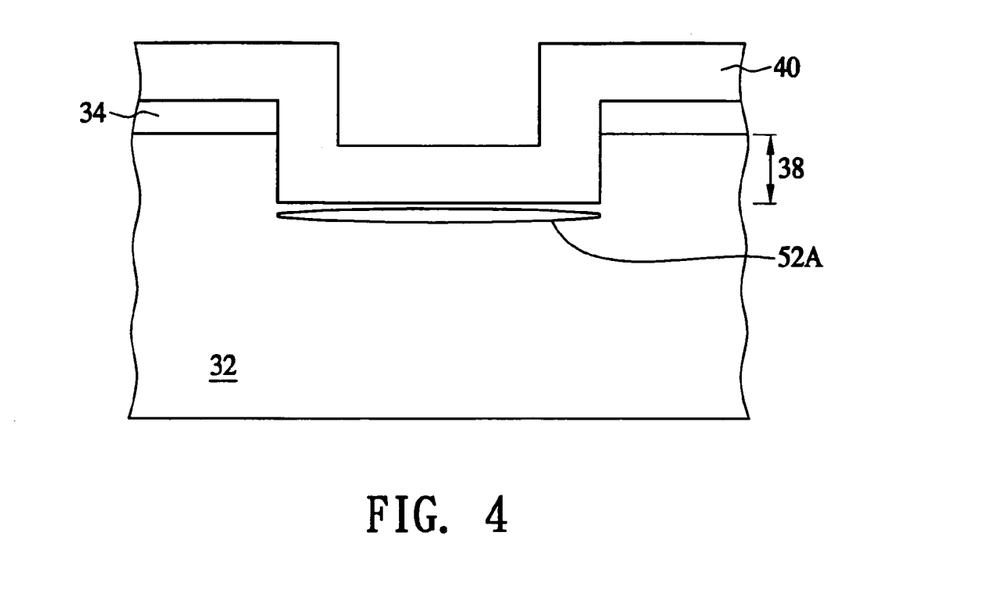
Figure 5:
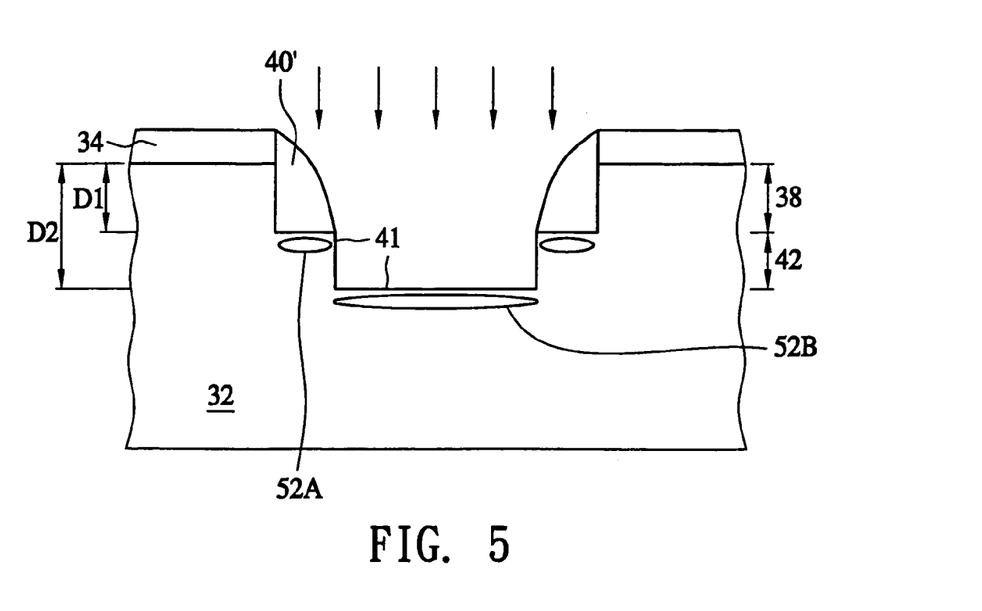

Referring to FIG. 4, a deposition process is performed to form a dielectric layer 40 on the semiconductor substrate 32, and the dielectric layer 40 is preferably made of silicon oxide and covers at least the first step surface 37. An etching process is then performed to form a first spacer 40' on the sidewall of the first depression 38, and the first spacer 40' and the mask layer 34 are used as an etching mask in another etching process to remove a portion of the semiconductor substrate 32 to form a second depression 42 having a second step surface 41. The second step surface 41 includes the sidewall and the bottom surface of the second depression 42, and the depth D1 of the first depression 38 is shallower than the depth D2 of the second depression 42. Subsequently, an implanting process is performed to implant dopants into the semiconductor substrate 32 to form a second doped region 52B under the second depression 42, as shown in FIG. 5.

Figure 6:
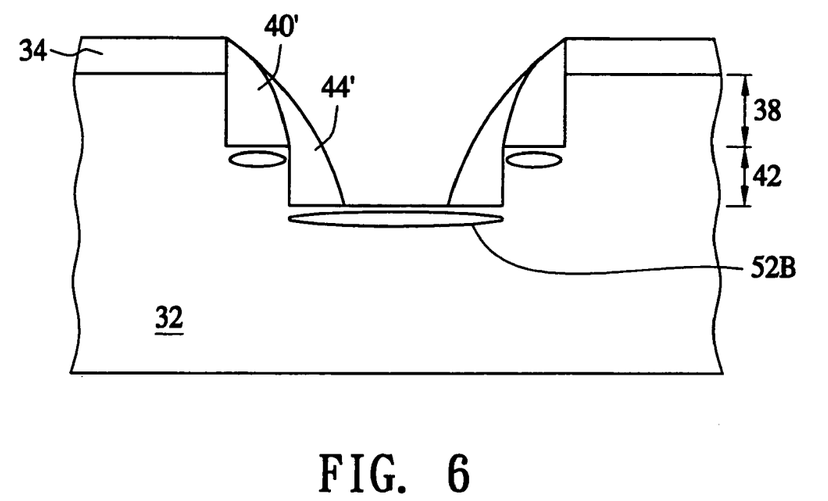

Referring to FIG. 6, a second spacer 44' preferably made of silicon oxide is formed on the sidewall of the second depression 42 by deposition and etching processes. The mask layer 34, the first spacer 40' and the second spacer 44' are used as an etching mask in an etching process to remove a portion of the semiconductor substrate 32 to form a third depression 46 having a third step surface 45 including the sidewall and the bottom surface of the third depression 46. Subsequently, an implanting process is performed to implant dopants into the semiconductor substrate 32 to form a doped region 52C under the third depression 46, as shown in FIG. 7.

Figure 8:
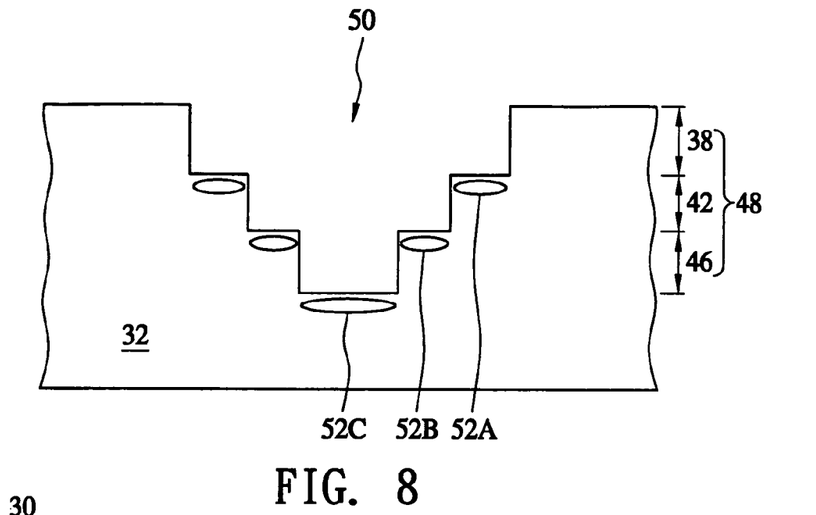

Referring to FIG. 8, the mask layer 34, the first spacer 40' and the second spacer 44' are removed by an etching process to form a recess 50 in the semiconductor substrate 32, and the first depression 38, the second depression 42 and the third depression 46 in the recess 50 form a multi-step structure 48. Subsequently, a thermal oxidation process is performed to form a gate oxide layer 54 on the surface of the semiconductor substrate 32, and a deposition process is then performed to form a conductive layer 56 on the gate oxide layer 54. The gate oxide layer 54 formed by the thermal oxidation process covers the multi-step structure 48.

Figure 9:
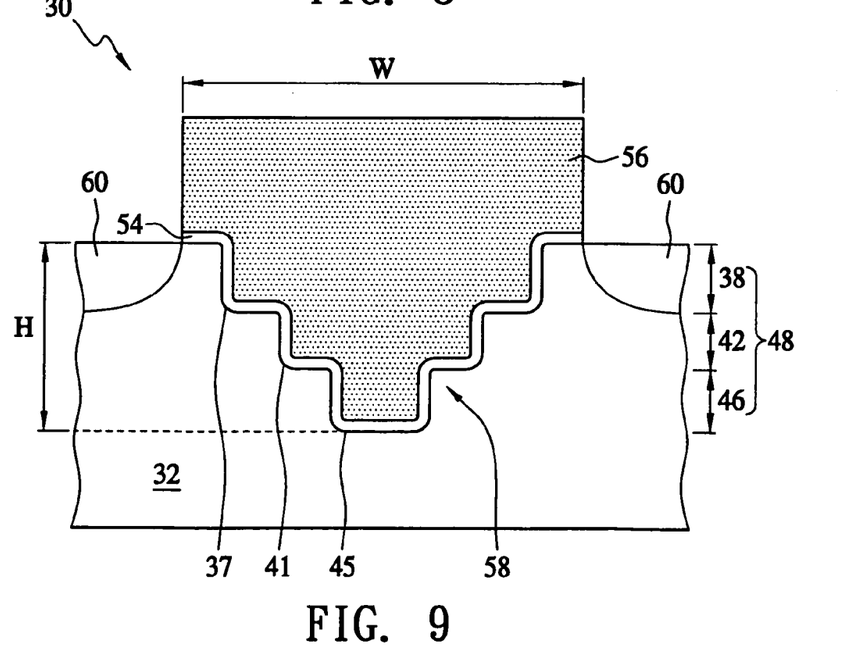
Figure 10:
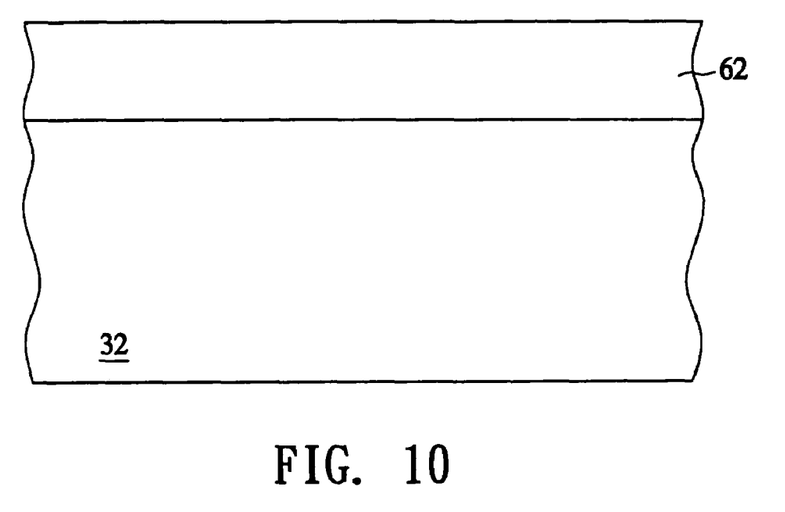
FIG. 10 to FIG. 13 illustrate a method for preparing a recessed gate structure according to another embodiment of the present invention.

A portion of the gate oxide layer 54 and the conductive layer 56 is removed by lithographic and etching processes to complete the recessed gate structure 30. Subsequently, the recessed gate structure 30 is used as an implanting mask in an implanting process to form two doped regions 60 serving as a source and a drain in the semiconductor substrate 32 at the two sides of the recessed gate structure 30, as shown in FIG. 9. There is a carrier channel 58 in the semiconductor substrate 32 under the multi-step structure 48, and the overall length of the carrier channel 58 is substantially equal to the summation of the lateral width and twice of the vertical height (H) of the recessed gate structure 30.

Figure 7:
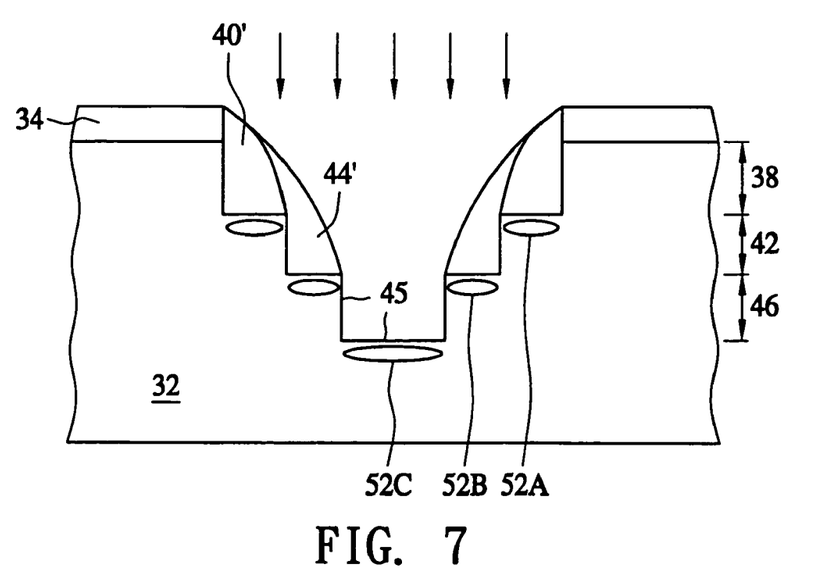

The implanting processes performed in FIG. 3, FIG. 5 and FIG. 7 may have different dosages, i.e., the dopant concentration in the doped regions 52A, 52B and 52C may be different from one to another. These implanting processes may implant dopants not only into the semiconductor substrate 32 under the bottom surface of each depression, but also into the entire surface of each depression. These implanting processes may use nitrogen-containing dopants selected from the group consisting of ions of nitrogen atom, nitrogen gas, nitrous oxide and nitric oxide, which can inhibit the reaction rate of the subsequent thermal oxidation process, i.e., allow control of the thickness of the gate oxide layer 54 on each step surface of the multi-step structure 48. Consequently, the nitrogen-containing dopants of different dosage causes the gate oxide layer 54 to have different thicknesses on each step surface of the multi-step structure 48, i.e., the thickness of the gate oxide layer 54 on one step surface of the multi-step structure 48 may be different from that on another step surface of the multi-step structure 48, which allows control of the threshold voltage of a transistor using the recessed gate structure 30.

Figure 11:
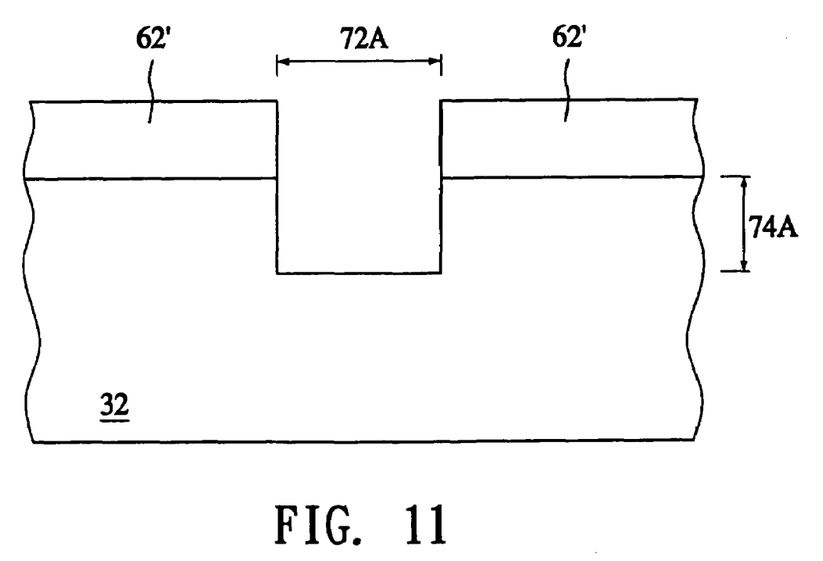

FIG. 10 to FIG. 13 illustrate a method for preparing a recessed gate structure 80 according to another embodiment of the present invention. A mask layer 62 is formed on a semiconductor substrate 32, a predetermined portion 72A of the mask layer 62 is then removed by lithographic and etching processes, and the maintaining mask layer 62' covers a predetermined portion of the semiconductor substrate 32. Preferably, the mask layer 62 is a photoresist layer or a dielectric layer, for example, made of silicon oxide. Subsequently, the mask layer 62' is used as an etching mask in an etching process to remove a portion of the semiconductor substrate 32 not covered by the etching mask to form a step 74A in the semiconductor substrate 32, as shown in FIG. 11.

Figure 12:
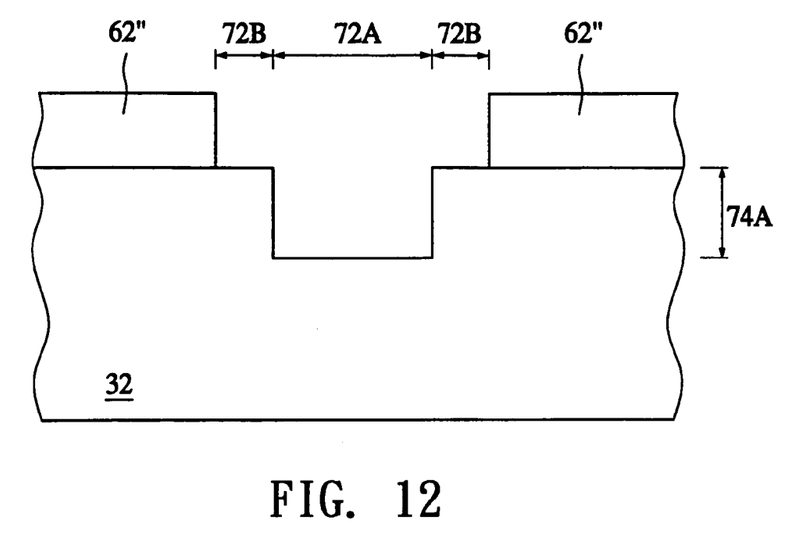
Figure 13:
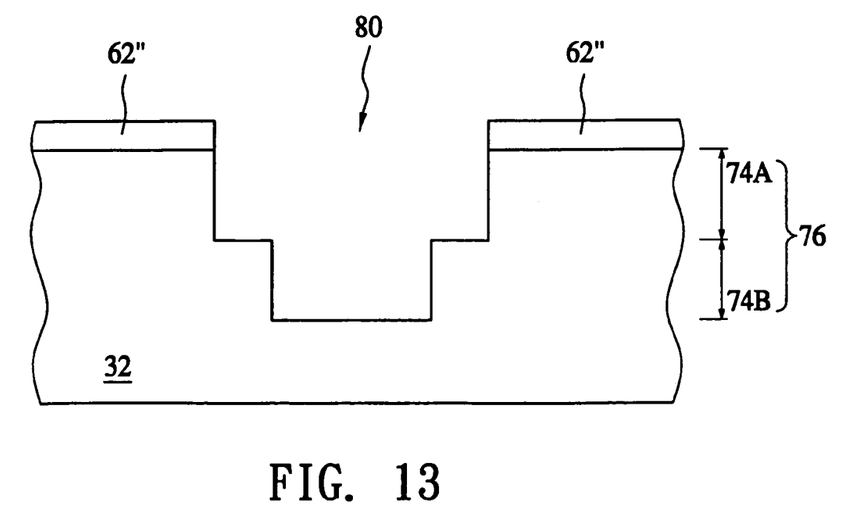

Referring to FIG. 12, a predetermined portion 72B of the mask layer 62' is removed by lithographic and etching processes to form a mask layer 62". The mask layer 62" is used in an etching process to remove a portion of the semiconductor substrate 32 to form a recess 80 having a multi-step structure 76 including two steps 74A and 74B, as shown in FIG. 13. Particularly, a recess having a multi-step structure with a different number of steps can be prepared by repeating the processes shown in FIG. 12 and FIG. 13.

Figure 14:
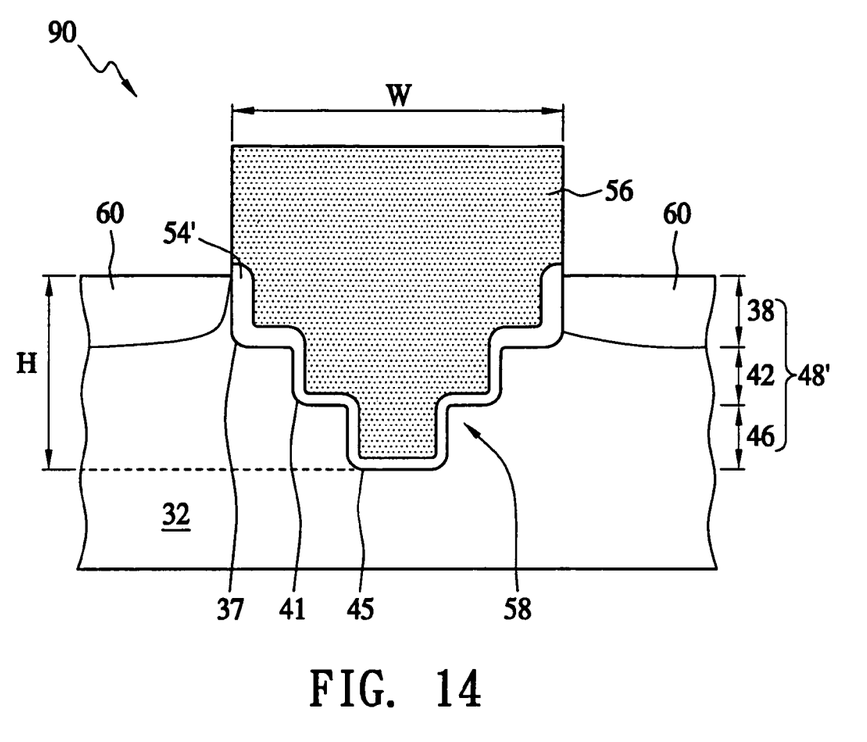
FIG. 14 illustrates a recessed gate structure according to another embodiment of the present invention.

FIG. 14 illustrates a recessed gate structure 90 according to another embodiment of the present invention. In comparison with the recessed gate structure 30 in FIG. 7 having the gate oxide layer 54 with a uniform thickness on the multi-step structure 40, the multi-step structure 90 has a gate oxide layer 54' with different thicknesses on the multi-step structure 48'. The multi-step structure 90 is prepared by processes substantially the same as that for preparing the multi-step structure 30, except the dosage of implanting processes on the first step surface 37 of the first depression 38 is less than those on the second step surface 41 of the second depression 42 and on the third step surface 45 of the third depression 46. Consequently, the prepared gate oxide layer 54' may have different thicknesses on each step surface of the multi-step structure 48'. For example, the thickness of the gate oxide layer 54' on the first step surface 37 is thicker than that on the second step surface 41 and on the third step surface 45.

Except for cases using nitrogen-containing dopants, these implanting processes may use boron-containing dopants or phosphorous-containing dopants, i.e., these implanting processes may use different dopants. The boron-containing dopants or phosphorous-containing dopants can increase the carrier concentration in the carrier channel 58 so as to control the threshold voltage of a transistor using the recessed gate structure 90.

In comparison with the conventional gate having a horizontally positioned carrier channel with a channel length substantially equal to the lateral width of the gate, one embodiment of the present invention provides a recessed gate structure having a multi-step carrier channel with a channel length substantially equal to the summation of the lateral width (W) and twice of the vertical height (H) of the recessed gate structure. Obviously, the channel length of the carrier under the recessed gate structure is longer than that of the conventional gate, and the short channel effect can therefore be effectively solved. In addition, several implanting processes with different dosages and different types of dopants can be performed during the fabrication process of the multi-step structure to control the thickness of the gate oxide layer and the threshold voltage of a transistor using the recessed gate structure.

The above-described embodiments of the present invention are intended to be illustrative only. Numerous alternative embodiments may be devised by those skilled in the art without departing from the scope of the following claims.

What is claimed is:

1. A recessed gate structure, comprising:
   a semiconductor substrate having a recess, the semiconductor substrate having a multi-step structure including a first depression and a second depression in the recess;
   a gate oxide layer positioned in the recess; and
   a conductive layer positioned on the gate oxide layer,
   wherein the first depression has a first step surface, the second depression has a second step surface, and the thickness of the gate oxide layer on the first step surface is different from the thickness of the gate oxide layer on the second step surface.

2. The recessed gate structure of claim 1, wherein the gate oxide layer covers the multi-step structure in the recess.

3. The recessed gate structure of claim 1, wherein the depth of the first depression is shallower than the depth of the second depression, and the thickness of the gate oxide layer on the first step surface is thicker than the thickness of the gate oxide layer on the second step surface.

4. The recessed gate structure of claim 1, further comprising a plurality of doped regions positioned in the semiconductor substrate under the multi-step structure.

5. The recessed gate structure of claim 4, wherein the plurality of doped regions comprises:
   a first doped region positioned in the semiconductor substrate under the first depression; and
   a second doped region positioned in the semiconductor substrate under the second depression, wherein the dopant concentration of the first doped region is different from the dopant concentration of the second doped region.

6. The recessed gate structure of claim 4, wherein the plurality of doped regions have different types of dopants.

7. The recessed gate structure of claim 1, further comprising a carrier channel positioned in the semiconductor substrate under the recess.

* * * * *